United States Patent
Hsiao et al.

(10) Patent No.: US 7,421,383 B2
(45) Date of Patent: Sep. 2, 2008

(54) METHOD FOR EXTRACTING AND MODELING SEMICONDUCTOR DEVICE SERIES RESISTANCE AND FOR SIMULATING A SEMICONDUCTOR DEVICE WITH USE THEREOF

(75) Inventors: Cheng Hsiao, Chiai (TW); Ke-Wei Su, Tainan (TW); Jaw-Kang Her, Taipei (TW)

(73) Assignee: Taiwan Semiconductor Mfg Co, Ltd, Hsin-Chu (TW)

( * ) Notice: Subject to any disclaimer, the term of this patent is extended or adjusted under 35 U.S.C. 154(b) by 676 days.

(21) Appl. No.: 10/346,048

(22) Filed: Jan. 15, 2003

(65) Prior Publication Data
US 2004/0138865 A1 Jul. 15, 2004

(51) Int. Cl.
*G06F 17/50* (2006.01)
(52) U.S. Cl. .......................................... 703/14; 716/4
(58) Field of Classification Search ............. 703/2, 703/27, 14; 716/406, 4
See application file for complete search history.

(56) References Cited

U.S. PATENT DOCUMENTS 5,825,673 A * 10/1998 Watanabe .................. 703/14
5,966,527 A * 10/1999 Krivokapic et al. .......... 703/14
2002/0133785 A1* 9/2002 Kondo ......................... 716/1

OTHER PUBLICATIONS

Emira et al., May 26-29, 2002, IEEE, Design tradeoffs of CMOS current mirrors using one-equation for all-region model, pp. V-45-V-48.*
Moon et al. Mar. 1991, New short-channel n-MOSFET current-voltage model in strong inversion and unified parameter extraction method, pp. 592-602.*
Sheu et al., 1987, IEEE, BISIM: Berkeley short-Channel IGFET Model for Most Transistors.*
Weste et al, 1994, Addison Wesley, Second eidtion, Principles of CMOS VLSI design, a systems perspectives. pp. 176-180.*
Weste et al., 1993, Addison-Wesley Publishing Company, Second Edition, "Principles of CMOS VLSI design", p. 181-184.*
Weste et al., 1993, Addison-Wesley Publishing Company, Second Edition, "Principles of CMOS VLSI design", p. Vii, 185-186.*
Pmlbey et al. Aug. 1988, IEEE, Simple mesurement of the properties of a distributed resistor-Capacitor line., pp. 1393-1395.*

* cited by examiner

*Primary Examiner*—Paul L Rodriguez
*Assistant Examiner*—Eunhee Kim
(74) *Attorney, Agent, or Firm*—Tung & Associates

(57) ABSTRACT

Semiconductor device junction simulation is carried out utilizing models that are developed with series resistance extractions that improve their fidelity particularly in the high current regions of device operation. The models may also be tailored to account for geometric considerations of the semiconductor devices thereby allowing for a more flexible model and simulation by providing for geometric scaling capabilities.

23 Claims, 2 Drawing Sheets

METHOD FOR EXTRACTING AND MODELING SEMICONDUCTOR DEVICE SERIES RESISTANCE AND FOR SIMULATING A SEMICONDUCTOR DEVICE WITH USE THEREOF

TECHNICAL FIELD

The present invention is generally related to microchip fabrication. More particularly, the invention relates to elemental semiconductor device simulation, modeling and parameter extractions.

BACKGROUND OF THE INVENTION

In the development of integrated circuits, particularly very large scale integrated circuits, it is desirable to reduce the number of design/prototype iterations. One tool available to circuit designers used to minimize the prototyping needed to validate performance of circuit designs is modeling and simulation. Modeling and simulation may be performed at various levels of circuitry, from complex networks down to individual elements, devices or even portions thereof.

In the simplest sense models are mathematical representations of certain performance characteristics of the device being modeled. Simulations rely upon these models and specific predetermined device parameters which correspond to model parameters. Simulations solve the model equations, alone or in combination with a network of other models. Some models are utilized by circuit designers to define a device as part of a circuit to evaluate a circuit performance. Other models may be utilized by a designer of a device in order to model and simulate the device itself through manipulation of certain parameter variables.

Relatively speaking, diode or semiconductor junction models are among the simplest of semiconductor device models. Junction models include formulas to calculate steady-state current vs. voltage (I-V characteristics), and charge storage within the device (typically, a nonlinear capacitance vs. applied voltage). Steady state current can usually be modeled well using the classical SPICE formula. In its basic form, the formula models current to increase substantially exponentially with forward voltage. The model also includes a parasitic series resistance term or parameter (series resistance).

The general form of such a model may be expressed as follows:

$I_D = I_S(e^{q(V_{Dx} - I_D R_{total})/nkT} - 1)$, or alternatively through rearrangement as $$V_{Dx} = \frac{nkT}{q} \ln\left(\frac{I_D}{I_S} + 1\right) + I_D \times R_{total},$$

wherein;
$V_{Dx}$ is voltage across the semiconductor device (device voltage),
$I_D$ is current through the semiconductor device (device current),
$I_S$ is the semiconductor device reverse saturation current,
$R_{total}$ is the semiconductor device lumped parasitic series resistance (series resistance),
n is the emission coefficient,
k is the boltzman constant
T is temperature, and
q is the electronic charge.

An even more simplified model equation may be expressed as $V_{Dx} = V_D + I_D R_{total}$, wherein $V_D$ is a semiconductor junction voltage,
$V_{Dx}$ is a semiconductor device voltage,
$I_D$ is a semiconductor device current, and
$R_{total}$ is the semiconductor device lumped parasitic series resistance (series resistance).

Certain models also have a variety of parameters to describe avalanche breakdown current or AC response, which parameters are not specifically called out in the above equations nor further addressed herein.

Typically, the basic SPICE model for a junction device is adequate to obtain reasonably good results. Of course, a model's fidelity is always dependent upon its parameter values and extraction techniques. The exponential nature of the junction model equations together with compromises in extraction techniques and parameter assumptions result in compromised accuracy, particularly in the so-called forward biased high current or knee region of the current-voltage characterization curve. A classic extraction technique and associated assumption regarding the series resistance of a semiconductor junction device relies upon defining the series resistance as a simple fixed value equaling sheet resistance divided by the active area of the device. FIG. 1 illustrates such a typical shortfall at 10 when such parasitic extraction technique is followed wherein modeled results (solid line) are shown to deviate from measured results (data points) on a typical linear scale of device voltage (V) versus device current ($I_D$). Such an assumption regarding the relationship between series resistance and active area geometry will result in additional errors if carried through to modeling and simulation directed toward scaling devices and simulations of scaled devices.

Therefore, what is needed is an improved method of modeling the parasitic resistance of a semiconductor junction device, particularly in the high current region of operation. What is also needed is an improved manner of simulating a semiconductor junction device having improved fidelity and accuracy.

SUMMARY OF THE INVENTION

Therefore, in accordance with one aspect of the present invention, an improved method of modeling the parasitic resistance of a semiconductor junction device is provided. In accordance with another aspect of the present invention, simulation of a semiconductor device utilizing an improved parasitic resistance model provides for improved correlation between measured and simulated parameters for such a device.

In accordance with one embodiment of the present invention, a method for extracting series resistance from a semiconductor device for use in a semiconductor device model includes the steps of: providing empirical current-voltage characterization data for the semiconductor device; providing extrapolated current-voltage characterization data from the empirical current-voltage characterization data in an exponential region thereof; calculating a series resistance of the semiconductor device as a function of a) the difference between the empirical and extrapolated voltage characterization data corresponding to a current point in a high current region of the semiconductor device and b) said current point.

In accordance with another embodiment of the present invention, a method for modeling series resistance in a semiconductor device model for use in simulating a semiconductor device includes the steps of: providing empirical current-voltage characterization data for a semiconductor device; providing extrapolated current-voltage characterization data from the empirical current-voltage characterization data in an exponential region thereof; for each of a plurality of current points within a high current region of the semiconductor device, calculating a respective series resistance of the semiconductor device corresponding thereto; extrapolating current-resistance characterization data from the plurality of high current region current points and respective series resistances to define a semiconductor device current-series resistance model.

In accordance with another embodiment of the present invention, a method for simulating a semiconductor device having a semiconductor junction includes the steps of: providing a semiconductor device model including a junction voltage portion and a parasitic voltage drop portion, said parasitic voltage drop portion being based upon a parasitic resistance through the semiconductor device characterized as a sigmoidal function of device current; and, solving the semiconductor device model to characterize the semiconductor device in accordance with a set of predetermined semiconductor device parameters.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
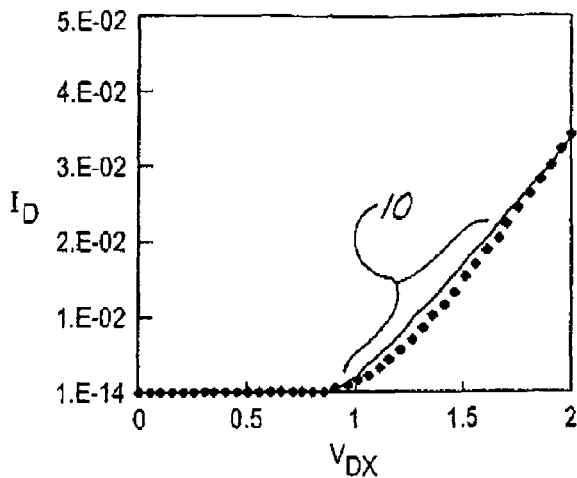
FIG. 1 illustrates a shortfall of known modeling and parasitic resistance extraction techniques in the high current region of device operation.

With reference first to FIG. 1, a block-schematic of a typical control and acquisition apparatus for model parameter extraction shows a semiconductor device under test (DUT) within a test fixture 20. A wafer contains a plurality of test devices for the purpose of being probed for signal stimulation 21 by test equipment 24 and response measurement 23 also by test equipment 24. In the present invention, the test signals applied are steady state or DC signals, voltage or current. The measured response signals are similarly steady state or DC quantities of voltage or current. Test equipment 24 may be programmable or, as illustrated, controlled by a PC, workstation or other user interface 25. In short, as is well understood by those skilled in the art, the plurality of test devices are subjected to a stimulus and measurement routine wherein current-voltage characterization data is acquired and stored in data files for later use and applications. Also shown in FIG. 2 a semiconductor simulation (performance) model 26 to simulated semiconductor device performance, such as previously discussed SPICE model may be included or interfaced in computer readable form with the user interface 25.

In characterizing a particular semiconductor device design, all of the plurality of individual devices under test will share the same design factors, including geometric scaling, within the production process limits and tolerances. It may be useful, however, as seen at a later point herein, that certain design factors may be different among the plurality of the individual devices under test in accordance with the purpose of the ultimate use of the characterization data. In the present invention, and in accordance with various embodiments thereof, the plurality of the individual devices under test may have different geometries, in particular differences in active region perimeters.

Figure 3:
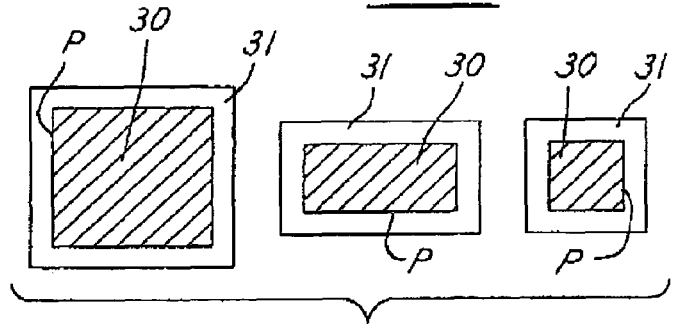
FIG. 3 shows exemplary test devices including active areas and active area perimeters in plan view.

FIG. 3 illustrates exemplary test devices including active areas in plan view layout. Each of the exemplary devices comprises a well junction device, for example including a PN diode, compatible with conventional CMOS processes; however, other types of diode or junction devices, such as a planar diode may be utilized. Each device is characterized by a respective active region 30 substantially defined by a respective perimeter P. An oxide and well-pickup region 31 substantially at the periphery of the active region 30 of each device is also shown, its import being more apparent at further points in the specification. Not separately shown are metal regions for interconnects where the metal interconnects may connect to the counter-doped regions comprising the PN junction. Connecting to the counter-doped regions at the active region for probing with the test equipment may be accomplished on the upper surface, on the opposite side of the substrate or outside of the active region on the upper surface in accordance with the particular junction device type and design.

Figure 2:
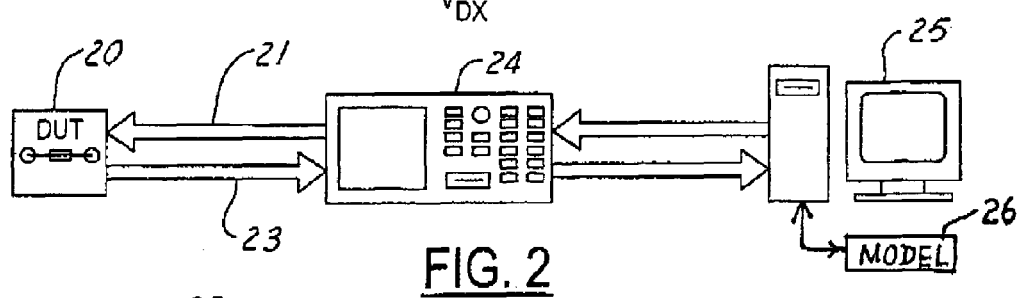
FIG. 2 is a block-schematic of a typical control and acquisition apparatus for model parameter extraction from test devices, a portion of which may be used for subsequent semiconductor device simulation in accordance with the present invention.
Figure 4:
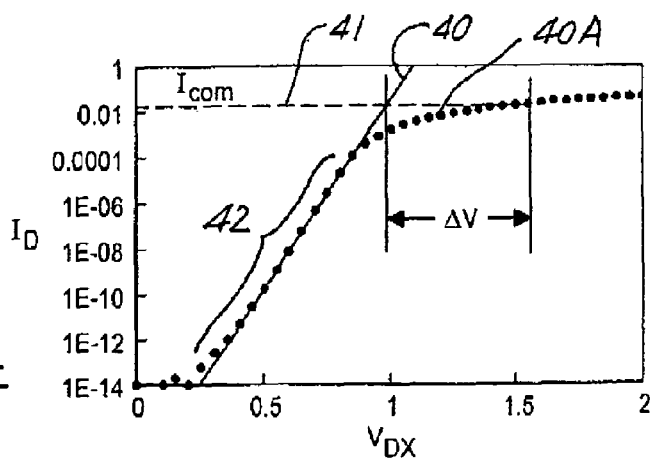
FIG. 4 illustrates empirical current-voltage data plotting and extrapolation useful in exemplifying the series resistance extraction method of the present invention.

Current-voltage (I-V) characterization data are empirically determined with respect to an exemplary semiconductor device as shown using the exemplary apparatus of FIG. 2. FIG. 4 illustrates the plotting of such I-V characterization data as discrete dots (e.g., 40A). As is conventional practice, semiconductor device reverse saturation current $I_S$ and the emission coefficient n are extracted from the exponentially increasing region 42 of the device current $I_D$ versus device voltage $V_{DX}$ data where $I_S$ is extracted from the intercept of the extrapolated exponential region data line 40 and n is extracted from the slope of $\ln(I_D)$ versus $V_{Dx}$.

The series resistance $R_{total}$ is next extracted in accordance with the present invention. Series resistance is calculated as a function of a) the difference between the empirical and extrapolated voltage characterization data corresponding to a common current point ($I_{com}$) 41 in a high current region of the semiconductor device and b) that current point. $I_{com}$ is selected from the empirically determined current points of the I-V characterization data (e.g., comprising data points 40A). The intersection of $I_{com}$ and the extrapolation 40 provides a first voltage and an empirically determined I-V voltage data point corresponding to $I_{com}$ provides a second voltage. $R_{total}$ corresponding to $I_{com}$ is then calculated as the difference between the first and second voltages ($\Delta V$) at this common current point $I_{com}$ divided by $I_{com}$. For each pair of empirically determined I-V characterization data, the current and voltage data are similarly utilized in the calculation of a plurality of series resistance $R_{total}$ extractions corresponding to respective current points.

Figure 5:
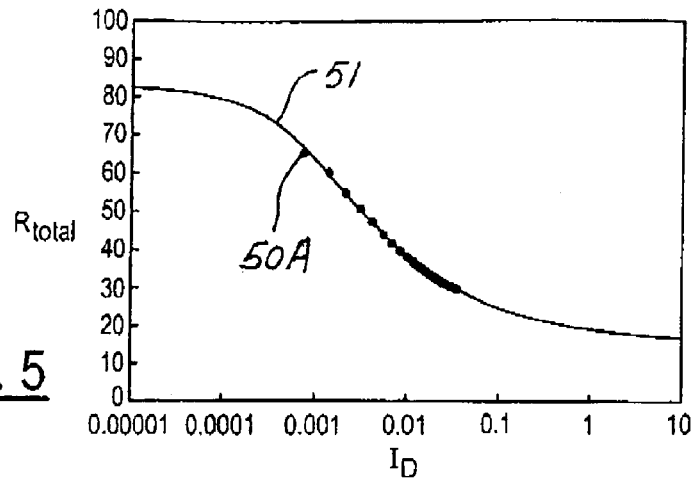
FIG. 5 illustrates lumped series resistance-device current data plotting and extrapolation useful in exemplifying the series resistance model of the present invention.

Turning now to FIG. 5, the extracted $R_{total}$ data is shown plotted as individual points (e.g., 50A) against an axis of device current $I_D$ on an exponential scale. The device current corresponds to the $I_{com}$ current point utilized in extracting the respective $R_{total}$ data. An extrapolation of the $R_{total}$-$I_D$ data is performed. A non-linear curve fitting function having substantially sigmoidal characteristics provides the preferred fit for the $R_{total}$-$I_D$ data to correspond to function 51 which may include a curve fitting parameter. Series resistance $R_{total}$ limits are established for corresponding device current $I_D$ limits at zero and infinity. The following equation provides satisfactory modeling of series resistance $R_{total}$ in accordance with the previously described extraction and extrapolation steps.

$$R_{total} = \frac{R_{OD}}{\left(1 + \frac{I_D \times R_{OD}}{2 \times \frac{kT}{q}}\right)^m} + R_{OM}$$

wherein
- $I_D$ is a semiconductor device current,
- k is the boltzman constant,
- T is a semiconductor device temperature,
- q is the electronic charge constant,
- m is a fitting parameter,
- $R_{OD}$ is a first resistance limit for the semiconductor device as semiconductor device current ($I_D$) approaches zero, and
- $R_{OM}$ is a second resistance limit for the semiconductor device as semiconductor device current ($I_D$) approaches infinity.

The first term containing the first resistance limit $R_{OD}$ varies as a function of device current $I_D$. The term is derived from factors that affect resistance under the active region, including current crowding effects. The second term containing the second resistance limit $R_{OM}$ does not vary in this model with device current $I_D$ and corresponds to resistance factors that are not influenced by active region factors including resistance under the oxide and metal routing or interconnect resistance. Therefore, $R_{OD}$ is an active region resistance limit for the semiconductor device as semiconductor device current ($I_D$) approaches zero, and $R_{OM}$ is a semiconductor device resistance limit as semiconductor device current ($I_D$) approaches infinity.

As had been previously alluded to, current-voltage characterizations of different test devices having geometrical dissimilarities in active region perimeter are useful in developing an even more sophisticated device design model that accounts for and allows its use in scaling of the modeled semiconductor device. It has been determined that a device parameter having significantly more influence upon geometric scaling accuracy than the oft cited active region area is the active region perimeter. Furthermore, it can be said that the series resistance of a subject semiconductor device varies inversely to the active region perimeter.

Taking the expanded version of $R_{total}$ wherein $$R_{total} = \frac{R_{OD}}{\left(1 + \frac{I_D \times R_{OD}}{2 \times \frac{kT}{q}}\right)^m} + R_{OM},$$

$R_{OD}$ is expanded to the form $$R_{OD} = \frac{R_{OD1}}{P}$$

and
$R_{OM}$ is expanded to the form $$\frac{R_{OX1}}{P} + R_C * N$$

wherein
- $R_{OD1}$ is a line resistance for the active region,
- $R_{OX1}$ is a line resistance for the oxide region,
- P is an active region perimeter,
- $R_C$ is a sheet resistance of a metal line layer, and
- N is the square of the metal interconnects.

Therefore, the model equation for $R_{total}$ becomes:

$$R_{total} = \frac{\frac{R_{OD1}}{P}}{\left(1 + \frac{I_D \times \frac{R_{OD1}}{P}}{2 \times \frac{kT}{q}}\right)^m} + \frac{R_{OX1}}{P} + R_C \times N$$

Figure 6:
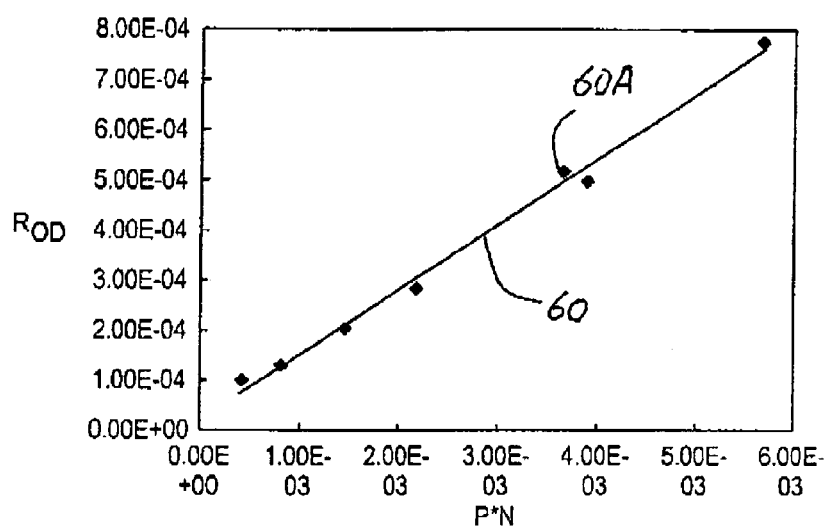
FIG. 6 illustrates active region resistance limit-reciprocal active area perimeter data plotting and extrapolation useful in exemplifying the series resistance model of the present invention.
Figure 7:
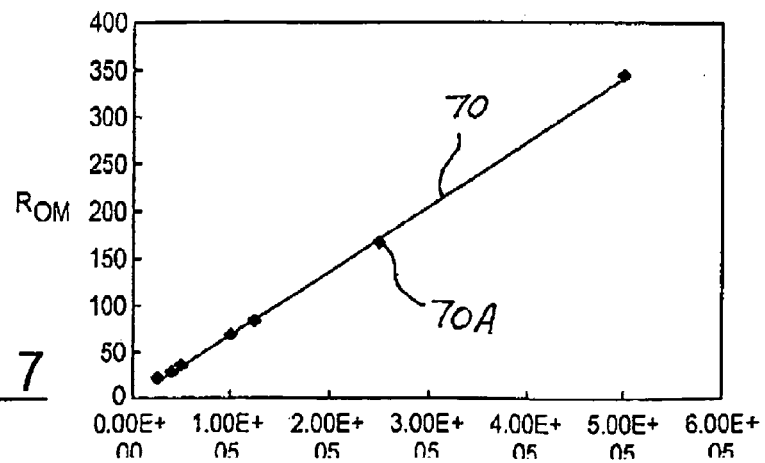
FIG. 7 illustrates an oxide/metal region resistance-metal square data plotting and extrapolation useful in exemplifying the series resistance model of the present invention.

The same methodology is followed in extracting $R_{total}$ and its resistance limits $R_{OD}$ and $R_{OM}$ for each of a plurality of semiconductor devices having diverse active region perimeters (perimeter lengths; see P in FIG. 3). These data (e.g., data point 60A, 70A) are plotted against perimeter dependent axes as shown in FIGS. 6 and 7 wherefrom $R_{OX1}$ and $R_{OD1}$ can be readily extracted according to linear data approximations (e.g., 60, 70) whereby geometric scaling is now within the capabilities of the model.

The invention has been described with respect to certain preferred embodiments intended to be taken by way of example and not by way of limitation. Certain alternative implementations and modifications may be apparent to one exercising ordinary skill in the art. Therefore, the scope of invention as disclosed herein is to be limited only with respect to the appended claims.

The invention in which an exclusive property or privilege is claimed are defined as follows:

What is claimed is:

1. A method for simulating a semiconductor device having a semiconductor junction to improve semiconductor device design, comprising:
    measuring a plurality of semiconductor devices to produce empirical current versus voltage characterization data for each semiconductor device;
    extrapolating the empirical current versus voltage characterization data for each semiconductor device to produce extrapolated current versus voltage characterization data in an exponentially increasing region of said current versus voltage characterization data;
    determining a series resistance value for each semiconductor device as a function of the difference between said empirical current versus voltage characterization data and said extrapolated current versus voltage characterization data at a selected current value, each semiconductor device having said series resistance value determined at a different selected current value;

deriving a function characterizing said determined series resistance values as a function of said selected current values;

wherein said function is a sigmoidal function having the form $$\frac{R_{OD}}{\left(1+\frac{I_D \times R_{OD}}{2\times \frac{kT}{q}}\right)^m} + R_{OM} \text{ wherein}$$

k is a predetermined constant,

T is the semiconductor device temperature, q is a predetermined constant, m is a fitting parameter, $I_D$ is the semiconductor device current, $R_{OD}$ is an active region resistance limit for the semiconductor device current as the semiconductor device current approaches zero, and $R_{OM}$ is the semiconductor device resistance limit as the semiconductor device current approaches infinity;

employing said function to determine a modeling series resistance value corresponding to a modeling current value;

inputting said modeling series resistance value into a semiconductor device performance model; and, simulating the performance of said semiconductor device with said determined series resistance value input into said semiconductor device performance model.

2. The method for simulating a semiconductor device as claimed in claim 1 wherein $R_{OD}$ is inversely proportional to a perimeter of the active region of the semiconductor device.

3. The method for simulating a semiconductor device as claimed in claim 1 wherein $R_{OM}$ comprises a resistance inversely proportional to a perimeter of the active region of the semiconductor device.

4. The method for simulating a semiconductor device as claimed in claim 1 wherein $R_{OD}$ is inversely proportional to a perimeter of the active region of the semiconductor device and $R_{OM}$ comprises a resistance inversely proportional to a perimeter of the active region of the semiconductor device.

5. The method for simulating a semiconductor device as claimed in claim 1 wherein $R_{OD}$ has the form $$\frac{R_{OD1}}{P}$$

wherein $R_{OM}$ has the form $$\frac{R_{OX1}}{P} + R_C \times N$$

wherein $R_{OD1}$ is a resistance comprising the active region, $R_{OX1}$ is a resistance comprising an oxide region, P is an active region perimeter, $R_C$ is a sheet resistance of a metal line layer, and N is a square of the number of the metal interconnects in the metal line layer.

6. The method of claim 1 wherein said semiconductor device performance model comprises a function having the form $$V_{Dx} = V_D I_D \times R_{total}$$

wherein $V_D$ is the semiconductor device junction voltage, $V_{Dx}$ is the semiconductor device voltage, $I_D$ is the semiconductor device current, and $R_{total}$ is said modeling series resistance.

7. The method for simulating a semiconductor device as claimed in claim 1 wherein said plurality of semiconductor devices is measured by a DC signal.

8. The method for simulating a semiconductor device as claimed in claim 6 wherein $V_D$ has the form $$\frac{nkT}{q}\ln\left(\frac{I_D}{I_S}+1\right) \text{ and}$$

wherein $R_{total}$ has the form $$\frac{R_{OD}}{\left(1+\frac{I_D \times R_{OD}}{2\times \frac{kT}{q}}\right)^m} + R_{OM}$$

wherein $I_S$ is the semiconductor device reverse saturation current, k is a predetermined constant, T is the semiconductor device temperature, q is a predetermined constant, m is a fitting parameter, $R_{OD}$ is an active region resistance limit for the semiconductor device current as the semiconductor device current approaches zero, and $R_{OM}$ is the semiconductor device current limit as the semiconductor device current approaches zero.

9. A method for extracting series resistance from a semiconductor device for use in a semiconductor device model to improve semiconductor device design, comprising:

generating a set of empirical current-voltage characterization data for the semiconductor device;

extrapolating current-voltage characterization data from the empirical current-voltage characterization data in an exponential region thereof;

determining a series resistance of the semiconductor device as a function of a) the difference between the empirical and extrapolated current-voltage characterization data corresponding to a current point in a high current region of the semiconductor device and b) said current point;

employing said determined series resistance to derive a function equal to a second series resistance value;

wherein said function is a sigmoidal function having the form $$\frac{R_{OD}}{\left(1+\frac{I_D \times R_{OD}}{2\times \frac{kT}{q}}\right)^m} + R_{OM} \text{ wherein}$$

k is a predetermined constant,
T is the semiconductor device temperature,
q is a predetermined constant,
m is a fitting parameter,
$I_D$ is the semiconductor device current,
$R_{OD}$ is an active region resistance limit for the semiconductor device current as the semiconductor device current approaches zero, and
$R_{OM}$ is the semiconductor device resistance limit as the semiconductor device current approaches infinity;
inputting said second series resistance value into a semiconductor device performance model; and,
simulating the performance of said semiconductor device with said second series resistance value input into said semiconductor device performance model.

10. A method for simulating a semiconductor device using a semiconductor device model to improve semiconductor device design, comprising:
generating empirical current-voltage characterization data for a plurality of semiconductor devices;
generating extrapolated current-voltage characterization data from the empirical current-voltage characterization data in an exponential region thereof for each of said plurality of semiconductor devices;
determining a respective series resistance for each semiconductor device from said extrapolated current-voltage characterization data, said extrapolated current-voltage characterization data comprising a selected current and a voltage difference comprising a high current region of said empirical current-voltage characterization data;
employing said respective determined series resistances to derive a semiconductor device current versus series resistance model;
determining a second series resistance using said derived semiconductor device current versus series resistance model;
wherein the series resistance model has the form $$\frac{R_{OD}}{\left(1 + \frac{I_D \times R_{OD}}{2 \times \frac{kT}{q}}\right)^m} + R_{OM}$$

inputting said determined second series resistance value into a semiconductor device performance model wherein
$I_D$ is the semiconductor device current,
k is a predetermined constant,
T is the semiconductor device temperature,
q is a predetermined constant,
m is a fitting parameter,
$R_{OD}$ is an active region resistance limit for the semiconductor device as semiconductor device current ($I_D$) approaches zero, and
$R_{OM}$ is the semiconductor device resistance limit as semiconductor device current ($I_D$) approaches infinity; and,
simulating the performance of said semiconductor device with said determined second series resistance value input into said semiconductor device performance model.

11. The method for simulating a semiconductor device as claimed in claim 10 wherein the series resistances of each semiconductor device is determined comprising the steps of:
extrapolating an exponentially increasing region of said empirical current-voltage characterization data to determine a first voltage value at an intersection of said extrapolation and said selected current value;
determining a second voltage value where said selected current value is equal to a current value in said high current region comprising said empirical current versus voltage characterization data; and,
determining said series resistance by dividing said selected current by a difference between said first and second voltages.

12. The method for simulating a semiconductor device as claimed in claim 10 wherein $R_{OD}$ is inversely proportional to a perimeter length of the active region of the semiconductor device and $R_{OM}$ comprises a resistance inversely proportional to a perimeter length of the active region of the semiconductor device.

13. The method for simulating a semiconductor device as claimed in claim 10 wherein each of a plurality of semiconductor devices has different active area perimeter length wherein said active area perimeters are employed to derive resistance parameters comprising said semiconductor device current versus series resistance model.

14. The method for simulating a semiconductor device as claimed in claim 10 wherein ROM comprises a resistance inversely proportional to a perimeter of the active region of the semiconductor device.

15. The method for simulating a semiconductor device as claimed in claim 10 wherein the step of generating empirical current-voltage characterization data comprises measuring said plurality of semiconductor devices by a DC signal.

16. A method for extracting a series resistance from a semiconductor device for use in a semiconductor device performance model to improve semiconductor device design comprising the steps of:
measuring a plurality of semiconductor devices to produce empirical current versus voltage characterization data for each semiconductor device each of said semiconductor devise comprising an active area defined by a perimeter having a perimeter length and an oxide region surrounding said active area;
extrapolating the empirical current versus voltage characterization data for each semiconductor device to produce extrapolated current versus voltage characterization data in an exponentially increasing region of said current versus voltage characterization data;
determining a series resistance value for each semiconductor device at a selected current value, each semiconductor device having said series resistance value determined at a different selected current value, wherein said series resistance value is determined by:
extrapolating said exponentially increasing region to determining a first voltage value at an intersection of said extrapolation and said selected current value;
determining a second voltage value where said selected current value is about equal to a current value comprising said empirical current versus voltage characterization data in a non-exponentially increasing region thereof; and,
determining said series resistance by dividing said selected current by a difference between said first and second voltages;
deriving a non-linear function characterizing said determined series resistance values as a function of said selected current values; wherein the non-linear function has the form $$\frac{R_{OD}}{\left(1+\frac{I_D \times R_{OD}}{2 \times \frac{kT}{q}}\right)^m} + R_{OM} \text{ wherein}$$

$I_D$ is the semiconductor device current,
k is a predetermined constant,
T is the semiconductor device temperature,
q is a predetermined constant,
m is a fitting parameter,
$R_{OD}$ is an active region resistance limit for the semiconductor device as semiconductor device current ($I_D$) approaches zero, and
$R_{OM}$ is the semiconductor device resistance limit as semiconductor device current ($I_D$) approaches infinity;
employing said non-linear function to determine a modeling series resistance value corresponding to a modeling current value;
inputting said modeling series resistance into a semiconductor device performance model; and,
simulating the performance of said semiconductor device with said modeling series resistance input into said semiconductor device performance model.

17. The method of claim 16, wherein said plurality of semiconductor devices have substantially the same active area geometry.

18. The method of claim 16, wherein said plurality of semiconductor devices comprise substantially different active area geometries comprising different active area perimeter lengths.

19. The method of claim 18 wherein said perimeter lengths are employed to derive resistance parameters comprising said non-linear function.

20. The method of claim 16 wherein $R_{OD}$ comprises a resistance inversely proportional to a perimeter of the active region of the semiconductor device.

21. The method of claim 16 wherein $R_{OM}$ comprises a resistance inversely proportional to a perimeter of the active region of the semiconductor device.

22. The method of claim 16, wherein said plurality of semiconductor devices are measured by a DC signal.

23. The method for simulating a semiconductor device as claimed in claim 10 wherein ROD comprises a resistance inversely proportional to a perimeter of the active region of the semiconductor device.

* * * * *